United States Patent
Chu et al.

(10) Patent No.: US 8,410,505 B2
(45) Date of Patent: Apr. 2, 2013

(54) LIGHT-EMITTING DIODE HAVING A REFLECTIVE LAYER BETWEEN A TRANSPARENT INSULATING LAYER AND AN ELECTRODE

(75) Inventors: Changhsin Chu, Tainan (TW); Kuohui Yu, Tainan (TW)

(73) Assignee: Chi Mei Lighting Technology Corp., Tainan (TW)

(*) Notice: Subject to any disclaimer, the term of this patent is extended or adjusted under 35 U.S.C. 154(b) by 106 days.

(21) Appl. No.: 13/073,812

(22) Filed: Mar. 28, 2011

(65) Prior Publication Data
US 2012/0043571 A1 Feb. 23, 2012

(30) Foreign Application Priority Data
Aug. 20, 2010 (TW) .................. 99127966 A

(51) Int. Cl.
H01L 33/00 (2010.01)
H01L 21/00 (2006.01)

(52) U.S. Cl. ............................................. 257/98; 438/29
(58) Field of Classification Search .................. 438/29; 257/98, E33.022, E33.062, E33.063, E33.065
See application file for complete search history.

(56) References Cited

U.S. PATENT DOCUMENTS
2004/0256631 A1  12/2004  Shin
2011/0089401 A1   4/2011  Hiraiwa et al.

FOREIGN PATENT DOCUMENTS
JP  2005-019939 A  1/2005
JP  2010-062425 A  3/2010

*Primary Examiner* — Kevin Parendo
(74) *Attorney, Agent, or Firm* — Morris Manning & Martin LLP; Tim Tingkang Xia, Esq.

(57) ABSTRACT

A light-emitting diode (LED) structure and a method for manufacturing the same. The LED structure includes a substrate, an illuminant epitaxial structure, first conductivity type and second conductivity type contact layers, a transparent insulating layer, first and second reflective layers, first and second barrier layers, and first conductivity type and second conductivity type electrodes.

7 Claims, 9 Drawing Sheets

![US 8,410,505 B2]

LIGHT-EMITTING DIODE HAVING A REFLECTIVE LAYER BETWEEN A TRANSPARENT INSULATING LAYER AND AN ELECTRODE

CROSS-REFERENCE TO RELATED PATENT APPLICATION

This non-provisional application claims priority under 35 U.S.C. §119 (a) on Patent Application No. 099127966 filed in Taiwan, R.O.C. on Aug. 20, 2010, the entire contents of which are hereby incorporated by reference.

FIELD OF THE INVENTION

The present invention relates to a light-emitting structure, and more particularly to a light-emitting diode (LED) structure and a method for manufacturing the same.

BACKGROUND OF THE INVENTION

FIG. 1 is a schematic sectional view of a conventional LED structure. The LED structure 124 includes a substrate 100, a buffer layer 102, an n-type semiconductor layer 104, an active layer (light emitting layer) 106, a p-type semiconductor layer 108, a p-type ohmic contact layer 112, a reflective layer 114, an n-type ohmic contact layer 116, an n-type electrode 118, a p-type electrode 120 and a passivation layer 122.

In the LED structure 124, the buffer layer 102 is disposed on the substrate 100. The n-type semiconductor layer 104 is disposed on the buffer layer 102. The active layer 106 is disposed on a part of the n-type semiconductor layer 104, so that the n-type semiconductor layer 104 has an exposed part 110. The p-type semiconductor layer 108 is disposed on the active layer 106. The p-type ohmic contact layer 112 and the reflective layer 114 are stacked in sequence on the p-type semiconductor layer 108. The p-type electrode 120 is disposed on a part of the reflective layer 114. Furthermore, the n-type ohmic contact layer 116 and the n-type electrode 118 are stacked in sequence on the exposed part 110 of the n-type semiconductor layer 104. The passivation layer 122 covers the p-type electrode 120, the reflective layer 114, the p-type ohmic contact layer 112, the p-type semiconductor layer 108, the active layer 106, the n-type semiconductor layer 104, the n-type ohmic contact layer 116 and the n-type electrode 118, and exposes a part of the p-type electrode 120 and a part of the n-type electrode 118.

In the conventional LED structure 124, the p-type ohmic contact layer 112 together with the reflective layer 114 directly contact the p-type semiconductor layer 108. When the LED structure 124 is operating under a large current for a long time, the heat generated by the active layer 106 easily deteriorates the reflective layer 114, and thus not only the power of the device is attenuated but also the luminous efficiency of the device may be influenced.

Furthermore, the flip-chip process requires the n-type electrode 118 and the p-type electrode 120 to have a large area. However, the n-type electrode 118 of the conventional LED structure 124 is directly disposed on the n-type ohmic contact layer 116, so when the n-type semiconductor layer 104 is defined, a larger area needs to be removed to enable the exposed part 110 of the n-type semiconductor layer 104 to have a large area, for disposing the n-type ohmic contact layer 116 and the n-type electrode 118 having the large area. Yet, as shown in FIG. 1, the increase of the area of the n-type ohmic contact layer 116 and the n-type electrode 118 will relatively reduce the light-emitting area of the active layer 108, thus reducing the luminous efficiency of the LED structure 124.

SUMMARY OF THE INVENTION

Accordingly, an aspect of the present invention is directed to an LED structure and a method for manufacturing the same. A transparent insulating layer is used to separate the reflective layer and the illuminant epitaxial structure, thus reducing the influence of the heat generated by the illuminant epitaxial structure on the stability of the reflective layer during high power operation.

Another aspect of the present invention is directed to an LED structure and a method for manufacturing the same, in which two conductivity type electrodes may be both disposed on the transparent insulating layer, thus reducing the area of the contact electrode and increasing the overall light-emitting area, and further improving the luminous efficiency of the LED structure.

Yet another aspect of the present invention is directed to an LED structure and a method for manufacturing the same, in which at least one pattern structure may be fabricated on the transparent insulating layer to control the light output direction and angle of the LED structure, thus improving the light extraction efficiency.

A further aspect of the present invention is directed to an LED structure and a method for manufacturing the same, in which two conductivity type electrodes have contact plugs extending to the contact layer, and the contact plugs may serve as a heat flow passage of the illuminant epitaxial structure, thus reducing the influence of the heat generated in operation on the LED structure.

An alternative aspect of the present invention is directed to an LED structure and a method for manufacturing the same, in which two conductivity type electrodes may be lifted and disposed on the transparent insulating layer, so that not only the area of the electrode can be increased but also the two conductivity type electrodes can be disposed in the same plane, which greatly reduces the difficulty of flip-chip, thus improving the reliability of the flip-chip process.

In one aspect of the present invention, an LED structure is provided. In one embodiment, the LED structure includes a substrate, an illuminant epitaxial structure, a first conductivity type contact layer, a second conductivity type contact layer, a transparent insulating layer, a first reflective layer, a second reflective layer, a first barrier layer, a second barrier layer, a first conductivity type electrode and a second conductivity type electrode. The illuminant epitaxial structure includes: a first conductivity type semiconductor layer disposed on the substrate; an active layer disposed on a first part of the first conductivity type semiconductor layer and exposing a second part of the first conductivity type semiconductor layer; and a second conductivity type semiconductor layer disposed on the active layer and having a conductivity type different from that of the first conductivity type semiconductor layer. The first conductivity type contact layer is disposed on the second part of the first conductivity type semiconductor layer. The second conductivity type contact layer is disposed on the second conductivity type semiconductor layer. The transparent insulating layer covers the illuminant epitaxial structure, the first conductivity type contact layer and the second conductivity type contact layer and has a surface, in which the transparent insulating layer includes a first contact hole and a second contact hole respectively exposing a part of the first conductivity type contact layer and a part of the second conductivity type contact layer. The first reflective layer extends on and covers the first contact hole and a part of the surface of the transparent insulating layer. The second reflective layer extends on and covers the second contact hole and the other part of the surface of the transparent insulating layer. The first barrier layer and the second barrier layer respectively cover the first reflective layer and the second reflective layer. The first conductivity type electrode is disposed on the first barrier layer and fills up the first contact hole. The second conductivity type electrode is disposed on the second barrier layer and fills up the second contact hole.

In another aspect of the present invention, an LED structure is further provided. In one embodiment, the LED structure includes a substrate, an illuminant epitaxial structure, a first conductivity type contact layer, a second conductivity type contact layer, a first reflective layer, a second reflective layer, a transparent insulating layer, a first barrier layer, a second barrier layer, a first conductivity type electrode and a second conductivity type electrode. The illuminant epitaxial structure includes: a first conductivity type semiconductor layer disposed on the substrate; an active layer disposed on a first part of the first conductivity type semiconductor layer and exposing a second part of the first conductivity type semiconductor layer; and a second conductivity type semiconductor layer disposed on the active layer and having a conductivity type different from that of the first conductivity type semiconductor layer. The first conductivity type contact layer is disposed on the second part of the first conductivity type semiconductor layer. The second conductivity type contact layer is disposed on the second conductivity type semiconductor layer. The first reflective layer is stacked on the first conductivity type contact layer. The second reflective layer is stacked on the second conductivity type contact layer. The transparent insulating layer covers the illuminant epitaxial structure, the first reflective layer and the second reflective layer and has a surface, in which the transparent insulating layer includes a first contact hole and a second contact hole respectively exposing a part of the first reflective layer and a part of the second reflective layer. The first barrier layer extends on and covers the first contact hole and a part of the surface of the transparent insulating layer. The second barrier layer extends on and covers the second contact hole and the other part of the surface of the transparent insulating layer. The first conductivity type electrode is disposed on the first barrier layer and fills up the first contact hole. The second conductivity type electrode is disposed on the second barrier layer and fills up the second contact hole.

According to one embodiment of the present invention, the first conductivity type electrode and the second conductivity type electrode are disposed in the same plane.

According to another embodiment of the present invention, a sidewall of the first contact hole and a sidewall of the second contact hole are both inclined relative to the illuminant epitaxial structure.

In a further aspect of the present invention, a method for manufacturing an LED structure is provided. In one embodiment, the method includes the following steps. An illuminant epitaxial structure is formed on a substrate. The illuminant epitaxial structure includes: a first conductivity type semiconductor layer disposed on the substrate; an active layer disposed on a first part of the first conductivity type semiconductor layer and exposing a second part of the first conductivity type semiconductor layer; a second conductivity type semiconductor layer disposed on the active layer and having a conductivity type different from that of the first conductivity type semiconductor layer. A first conductivity type contact layer is formed on the second part of the first conductivity type semiconductor layer. A second conductivity type contact layer is formed on the second conductivity type semiconductor layer. A transparent insulating layer covering the illuminant epitaxial structure, the first conductivity type contact layer and the second conductivity type contact layer is formed. A first contact hole and a second contact hole are formed in the transparent insulating layer, in which the first contact hole and the second contact hole respectively expose a part of the first conductivity type contact layer and a part of the second conductivity type contact layer. A first reflective layer extending on and covering the first contact hole and a part of a surface of the transparent insulating layer is formed. A second reflective layer extending on and covering the second contact hole and the other part of the surface of the transparent insulating layer is formed. A first barrier layer and a second barrier layer respectively covering the first reflective layer and the second reflective layer are formed. A first conductivity type electrode is formed on the first barrier layer and fills up the first contact hole. A second conductivity type electrode is formed on the second barrier layer and fills up the second contact hole.

In yet another aspect of the present invention, a method for manufacturing an LED structure is further provided. In one embodiment, the method includes the following steps. An illuminant epitaxial structure is formed on a substrate. The illuminant epitaxial structure includes: a first conductivity type semiconductor layer disposed on the substrate; an active layer disposed on a first part of the first conductivity type semiconductor layer and exposing a second part of the first conductivity type semiconductor layer; and a second conductivity type semiconductor layer disposed on the active layer and having a conductivity type different from that of the first conductivity type semiconductor layer. A first conductivity type contact layer is formed on the second part of the first conductivity type semiconductor layer. A second conductivity type contact layer is formed on the second conductivity type semiconductor layer. A first reflective layer is formed on the first conductivity type contact layer. A second reflective layer is formed on the second conductivity type contact layer. A transparent insulating layer covering the illuminant epitaxial structure, the first reflective layer and the second reflective layer is formed. A first contact hole and a second contact hole are formed in the transparent insulating layer, in which the first contact hole and the second contact hole respectively expose a part of the first reflective layer and a part of the second reflective layer. A first barrier layer extending on and covering the first contact hole and a part of a surface of the transparent insulating layer is formed. A second barrier layer extending on and covering the second contact hole and the other part of the surface of the transparent insulating layer is formed. A first conductivity type electrode is formed on the first barrier layer and fills up the first contact hole. A second conductivity type electrode is formed on the second barrier layer and fills up the second contact hole.

According to one embodiment of the present invention, the step of forming the first contact hole and the second contact hole further includes making a sidewall of the first contact hole and a sidewall of the second contact hole be both inclined relative to the illuminant epitaxial structure.

According to another embodiment of the present invention, the method for manufacturing an LED structure further includes forming at least one pattern structure in the surface of the transparent insulating layer between the step of forming the first contact hole and the second contact hole and the step of forming the first barrier layer.

According to the embodiments of the present invention, the transparent insulating layer is used to separate the reflective layer and the illuminant epitaxial structure, thus effectively reducing the influence of the heat generated during high power operation on the LED device. Furthermore, since the two conductivity type electrodes may be both lifted and disposed on the transparent insulating layer, the entire light-emitting area is increased and the area of the electrode is expanded. The two conductivity type electrodes can be disposed in the same plane, which is beneficial to reducing the difficulty of the flip-chip process, thus improving the reliability of the flip-chip process. Moreover, at least one pattern structure may be disposed on the transparent insulating layer to control the light-emitting direction of the LED structure, thus improving the light extraction efficiency of the device. Meanwhile, the two conductivity type electrodes have contact plugs extending to the contact layer. Since the contact plugs may serve as the heat flow passage of the illuminant epitaxial structure, the influence of the heat generated in operation on the LED structure can be reduced.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
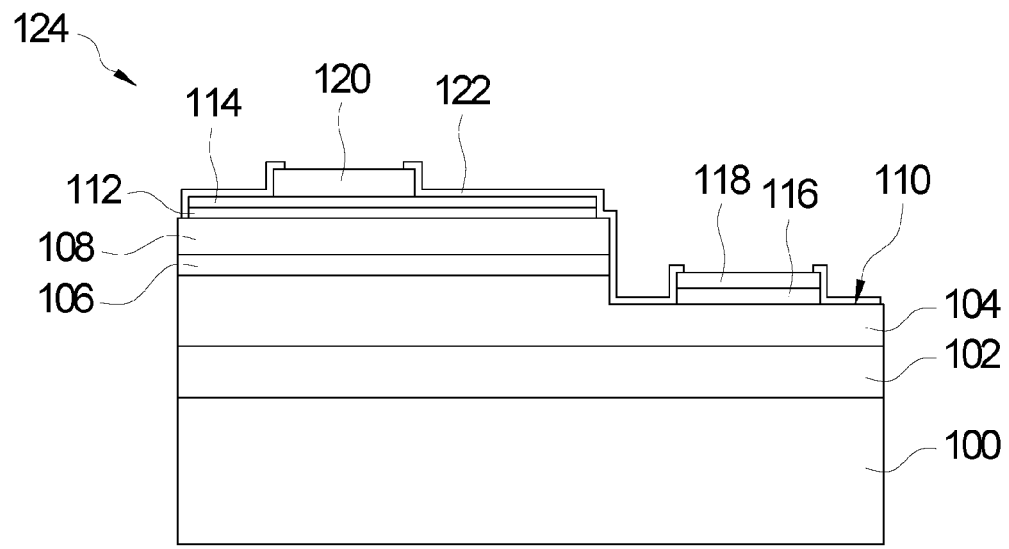
FIG. 1 is a schematic sectional view of a conventional LED structure.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 2A to 2E are sectional views illustrating manufacturing processes of an LED structure according to one embodiment of the present invention. In this embodiment, firstly, a transparent substrate 200 is provided. The material of the substrate 200 may be for example sapphire. Then, a buffer layer 202 is selectively formed on the substrate 200 by epitaxy, e.g. Metal-Organic Chemical Vapor Deposition (MOCVD). The material of the buffer layer 202 may be an undoped semiconductor, e.g. undoped GaN-series material. Afterwards, an illuminant epitaxial structure is grown on the buffer layer 202 by epitaxy, e.g. MOCVD. In this embodiment, the illuminant epitaxial structure may include a first conductivity type semiconductor layer 204, an active layer 210 and a second conductivity type semiconductor layer 212 stacked in sequence on the buffer layer 202. The first conductivity type semiconductor layer 204 and the second conductivity type semiconductor layer 212 have different conductivity types. For example, one of the first conductivity type semiconductor layer 204 and the second conductivity type semiconductor layer 212 is n-type, and the other is p-type. The material of the illuminant epitaxial structure may be for example a GaN-series material. The active layer 210 may be for example a multiple quantum well (MQW) structure.

Figure 2A:
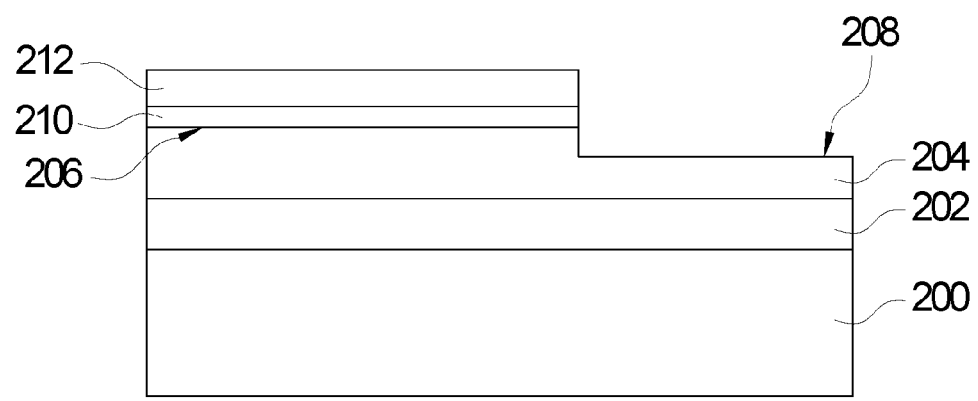
FIGS. 2A to 2E are sectional views illustrating processes of an LED structure according to one embodiment of the present invention.

As shown in FIG. 2A, after the illuminant epitaxial structure is grown, the illuminant epitaxial structure is defined by for example lithography and etching to remove a part of the second conductivity type semiconductor layer 212, a part of the active layer 210 and a part of the first conductivity type semiconductor layer 204, thus forming a mesa. After the mesa is defined, the first conductivity type semiconductor layer 204 has a first part 206 and a second part 208, in which the second conductivity type semiconductor layer 212 and the active layer 210 are disposed on the first part 206 of the first conductivity type semiconductor layer 204, and the second part 208 is exposed.

Figure 2B:
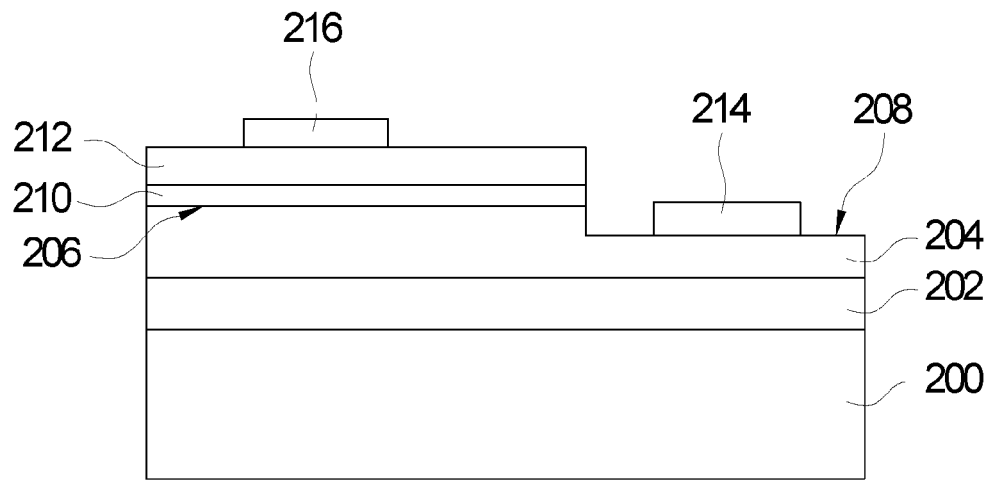

Then, a first conductivity type contact layer 214 and a second conductivity type contact layer 216 are formed by for example evaporation. As shown in FIG. 2B, the first conductivity type contact layer 214 and the second conductivity type contact layer 216 are respectively disposed on the second part 208 of the first conductivity type semiconductor layer 204 and a part of the second conductivity type semiconductor layer 212. The first conductivity type contact layer 214 and the second conductivity type contact layer 216 may be ohmic contact layers. When the first conductivity type is n-type, the material of the first conductivity type contact layer 214 may be for example indium tin oxide (ITO), TiAl, Cr/Pt/Au or Cr/Au. When the second conductivity type is p-type, the second conductivity type contact layer 216 may be a transparent oxide structure, e.g. a monolayer or multilayer structure of ITO, ZnO, AZO, GZO, $In_2O_3$ and $SnO_2$. In another embodiment, the material of the second conductivity type contact layer 216 may be Ni/Au or Ni/Ag.

Figure 2C:
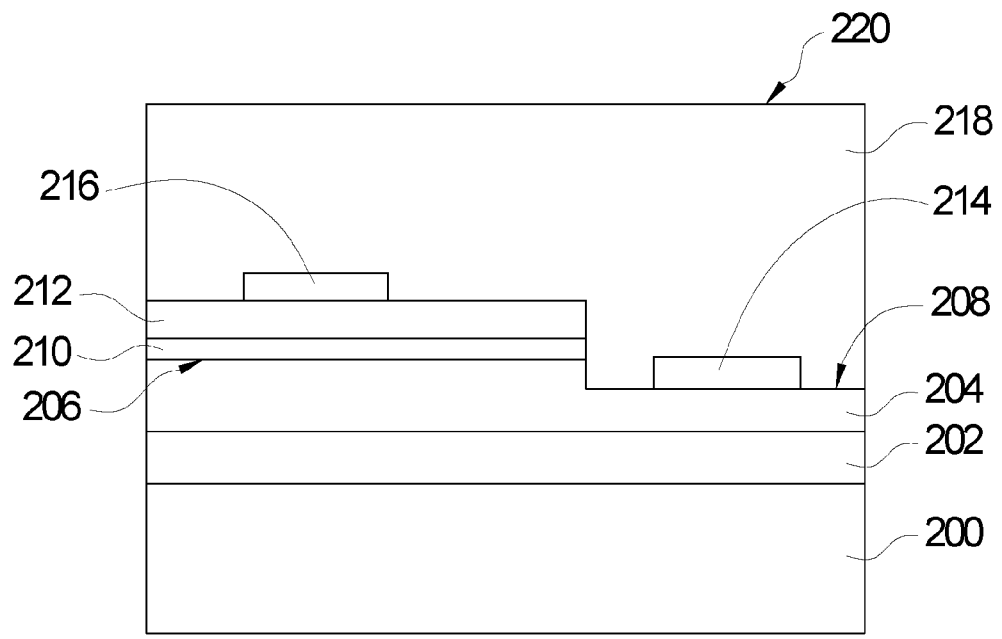

Thereafter, as shown in FIG. 2C, a transparent insulating layer 218 is formed by deposition or coating, e.g. spin coating, to cover the first conductivity type semiconductor layer 204, the active layer 210 and the second conductivity type semiconductor layer 212 of the illuminant epitaxial structure, as well as the first conductivity type contact layer 214 and the second conductivity type contact layer 216. The transparent insulating layer 218 preferably has a planarized surface 220, and the surface 220 is disposed opposite to the illuminant epitaxial structure. In an example, the material of the transparent insulating layer 218 may be for example spin on glass (SOG), a high polymer, $SiO_2$ or $TiO_2$. The thickness of the transparent insulating layer 218 is preferably between 0.5 μm and 100 μm. In one embodiment transparent oxide layer is formed by spin coating to serve as transparent insulating layer 218.

Figure 2D:
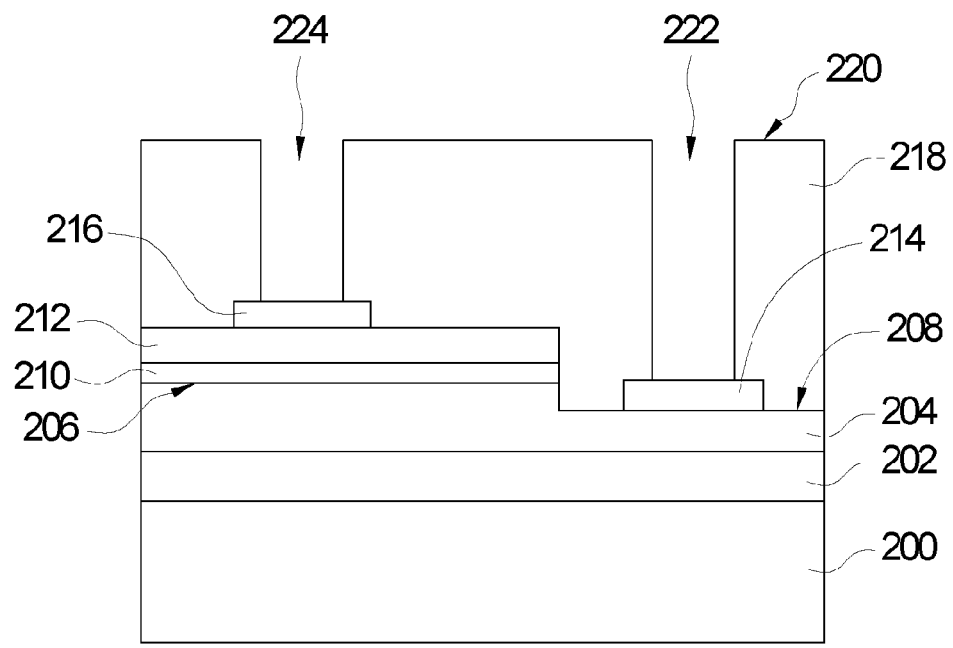

Then, a part of the transparent insulating layer 218 is removed by for example etching to form contact holes 222, 224 in the transparent insulating layer 218. As shown in FIG. 2D, the contact holes 222, 224 respectively expose a part of the first conductivity type contact layer 214 and a part of the second conductivity type contact layer 216.

The LED structure may include at least one first conductivity type contact layer 214 and at least one second conductivity type contact layer 216, that is, the number of the first conductivity type contact layer 214 and the second conductivity type contact layer 216 may respectively be one or more. FIG. 2F is a schematic top view of distribution of a first conductivity type contact layer, a second conductivity type contact layer and corresponding contact holes of an LED structure according to one embodiment of the present invention. Each first conductivity type contact layer 214 is configured with a contact hole preset region 222a, and each second conductivity type contact layer 216 is configured with a contact hole preset region 224a. The contact hole 222 is formed on the contact hole preset region 222a of the first conductivity type contact layer 214, and the contact hole 224 is formed on the contact hole preset region 224a of the second conductivity type contact layer 216.

Figure 2E:
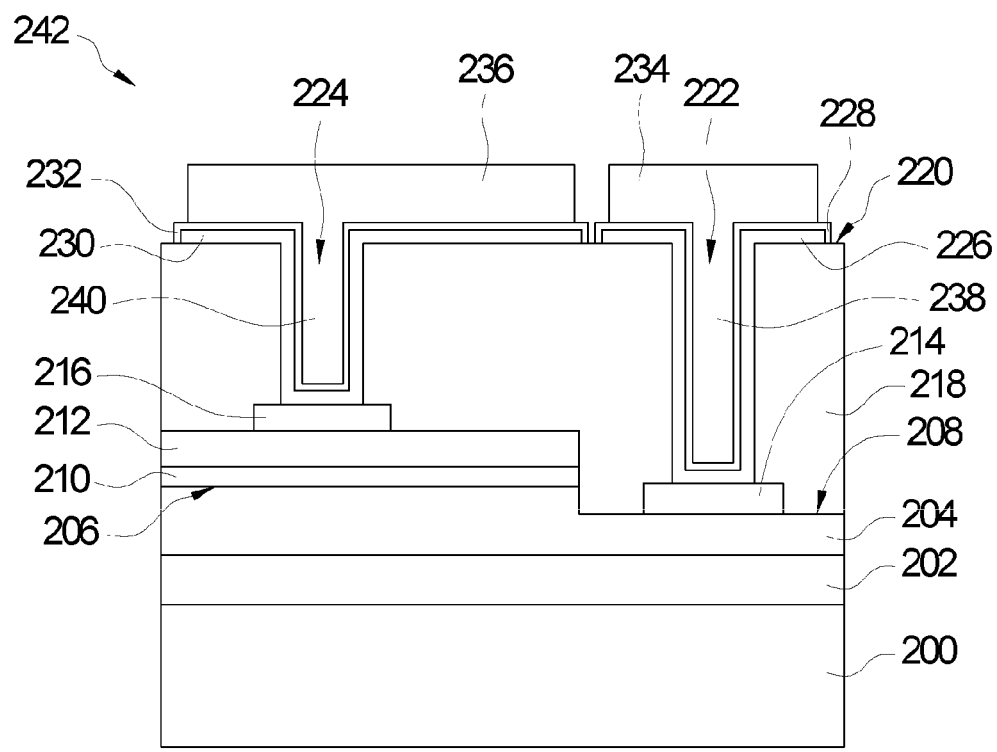
Figure 2F:
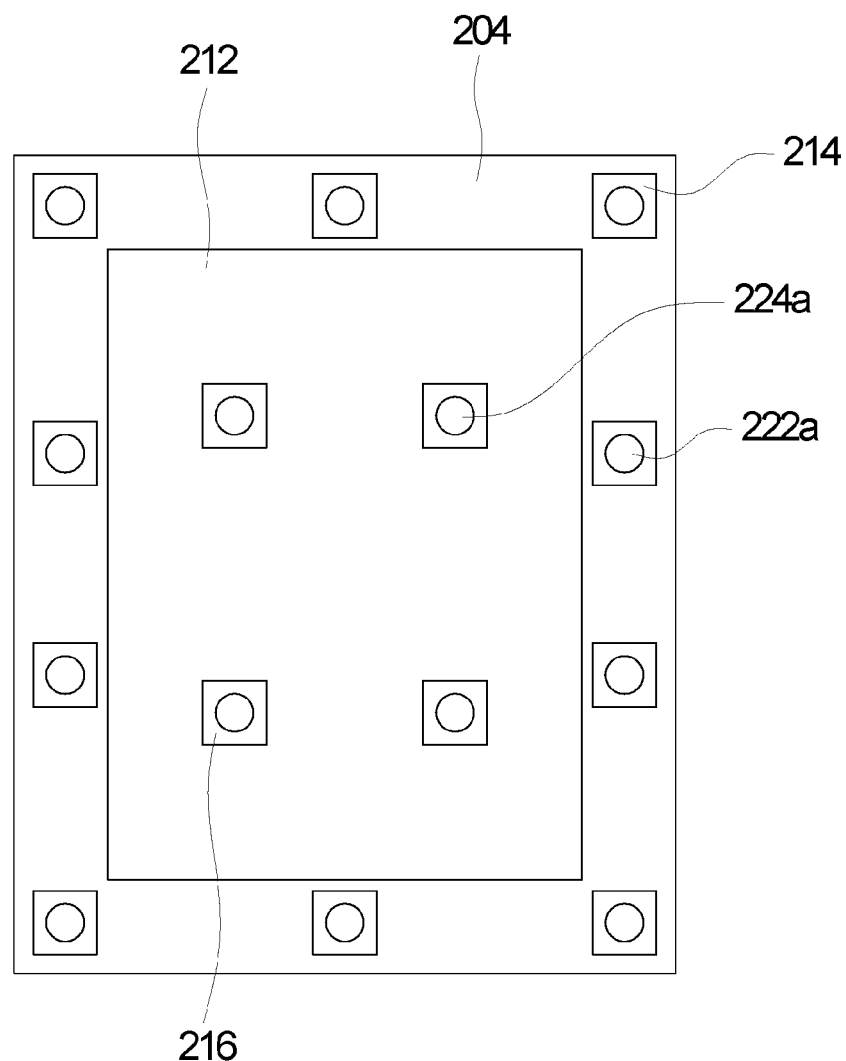
FIG. 2F is a schematic view of distribution of a first conductivity type contact layer, a second conductivity type contact layer and corresponding contact holes of an LED structure according to one embodiment of the present invention.

Referring to FIG. 2E, then, reflective layers 226, 230 are formed. The reflective layer 226 extends on and covers the contact hole 222 and a part of the surface 220 of the transparent insulating layer 218. The reflective layer 230 extends on and covers the contact hole 224 and the other part of the surface 220 of the transparent insulating layer 218. The reflective layers 226 and 230 are not in contact. In one embodiment, the reflective layers 226, 230 preferably have a structure of at least two layers. That is, at least one attachment film is firstly formed, and then a reflective film is formed on the attachment film. The material of the attachment film may be for example Ti, Ni or TiW alloy, and the material of the reflective film may be for example Al or Ag.

Then, barrier layers 228, 232 respectively covering the reflective layers 226, 230 are selectively formed. The barrier layers 228 and 232 are not in contact. The material of the barrier layers 228, 232 may be for example Ti, TiW alloy, W, Pt, Ni or any combinations thereof. The barrier layers 228, 232 may respectively prevent the diffusion between the reflective layer 226 and a first conductivity type electrode 234 formed in the following process and the diffusion between the reflective layer 230 and a second conductivity type electrode 236 formed in the following process.

Thereafter, the first conductivity type electrode 234 and the second conductivity type electrode 236 are formed by for example evaporation, sputtering, electroplating or chemical plating, thus finishing the fabrication of an LED structure 242. The first conductivity type electrode 234 is disposed on the barrier layer 228 and fills up the contact hole 222. The second conductivity type electrode 236 is disposed on the barrier layer 232 and fills up the contact hole 224. The part of the first conductivity type electrode 234 disposed on the contact hole 222 may be referred to as a contact plug 238, and the part of the second conductivity type electrode 236 disposed on the contact hole 224 may be referred to as a contact plug 240. In one embodiment, the first conductivity type electrode 234 and the second conductivity type electrode 236 may include a multilayer structure, e.g. Au or Ni and a eutectic metal of AuSn or AgSnCu disposed above Au or Ni.

Figure 2G:
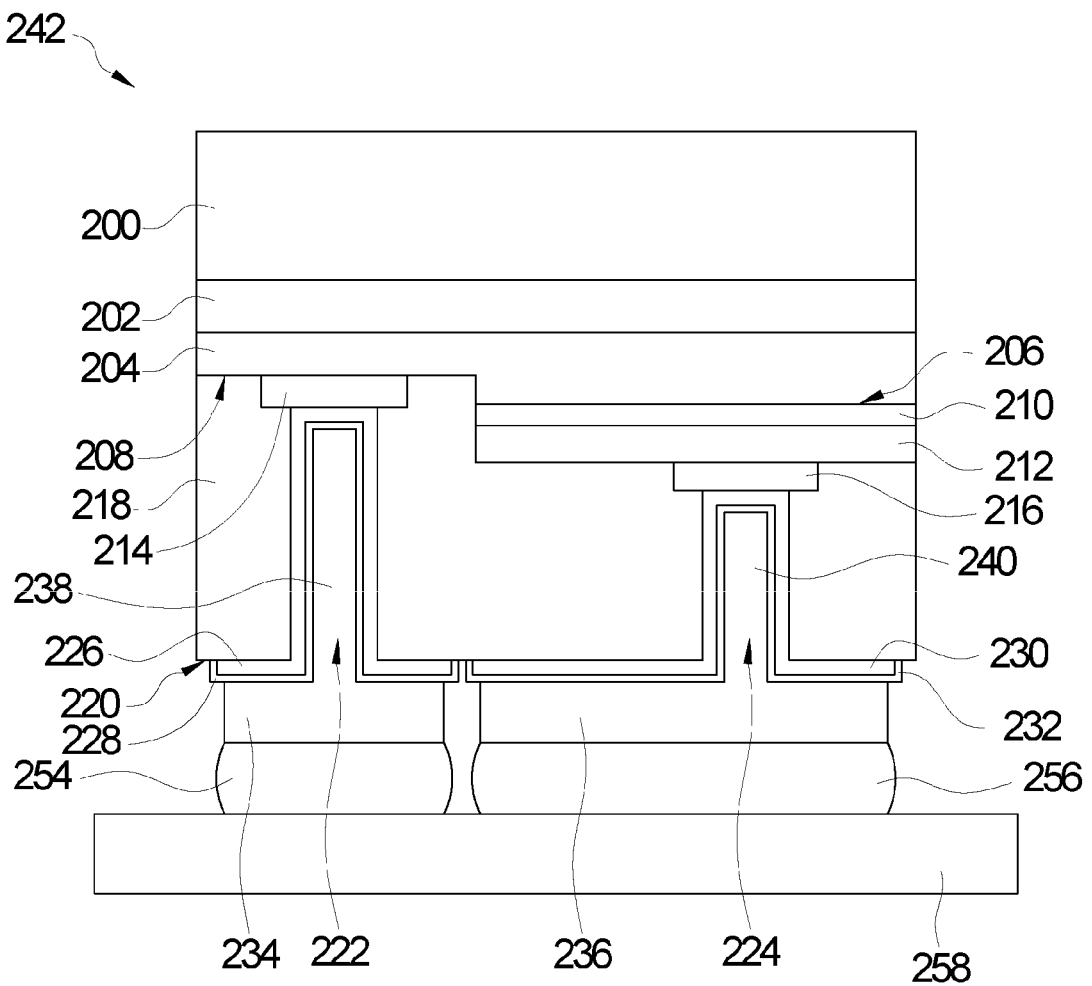
FIG. 2G is a schematic sectional view of a package structure of an LED structure according to one embodiment of the present invention.

In one embodiment, in addition to the contact plugs 238, 240, the first conductivity type electrode 234 and the second conductivity type electrode 236 are preferably disposed in the same plane, as shown in FIG. 2E. After the fabrication of the LED structure 242 is finished, a packaging process of the LED structure 242 may be carried out. In this embodiment, the LED structure 242 is suitable for a flip-chip packaging process. During the flip-chip packaging process of the LED structure 242, solder bumps 254, 256 may be firstly formed on the first conductivity type electrode 234 and the second conductivity type electrode 236 respectively. Meanwhile, a package substrate 258 is provided. Then, as shown in FIG. 2G, the LED structure 242 is inverted and covered on a preset region of the package substrate 258, thus substantially finishing the flip-chip packaging of the LED structure 242. The first conductivity type electrode 234 and the second conductivity type electrode 236 of the LED structure 242 are electrically connected to a preset circuit on the package substrate 258 respectively by the solder bumps 254, 256.

Since the first conductivity type electrode 234 and the second conductivity type electrode 236 are disposed in the same plane, the difficulty of the flip-chip of the LED structure 242 is greatly reduced, thus improving the reliability of the flip-chip process.

Figure 3:
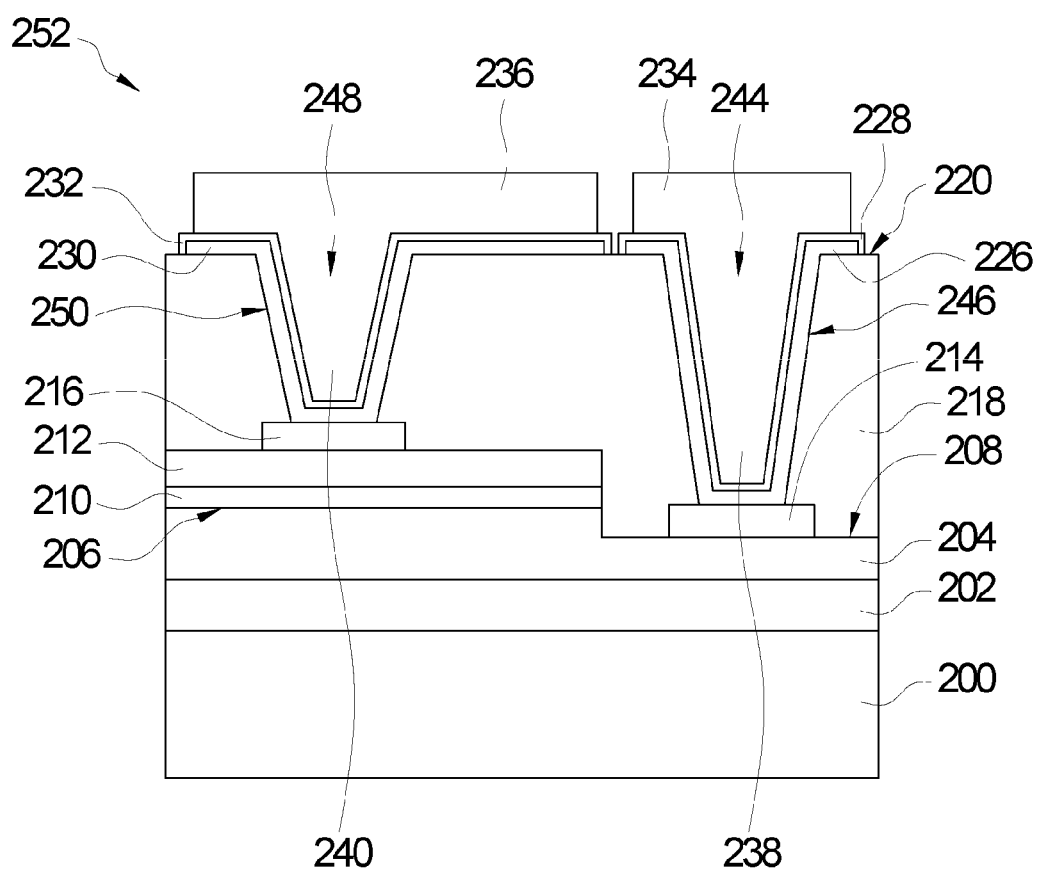
FIG. 3 is a sectional view of an LED structure according to another embodiment of the present invention.

In the present invention, a pattern structure may also be fabricated on the transparent insulating layer of the LED structure to control the light output direction of the LED structure. FIG. 3 is a sectional view of an LED structure according to another embodiment of the present invention. The architecture of the LED structure 252 is substantially the same as that of the LED structure 242 in the above embodiment. The difference of the two lies in that sidewalls of the two contact holes 222, 224 of LED structure 242 are substantially perpendicular to the illuminant epitaxial structure, while a sidewall 246 of a contact hole 244 and a sidewall 250 of a contact hole 248 of the LED structure 252 are both inclined relative to the illuminant epitaxial structure.

In this embodiment, by making the sidewall 246 of the contact hole 244 and the sidewall 250 of the contact hole 248 be inclined relative to the illuminant epitaxial structure when forming the contact holes 244, 248 in the transparent insulating layer 218, the reflection direction of the light emitted to the reflective layers 226, 230 may be changed, thus controlling the light output direction and angle of the LED structure 252.

In other embodiments, in addition to changing the inclined angle of the sidewall of the contact hole relative to the illuminant epitaxial structure, the surface 220 of the transparent insulating layers 218 may be patterned so that the surface 220 of the transparent insulating layer 218 have one or more pattern structures, e.g. regular pattern structures or irregular pattern structures. By disposing at least one pattern structure on the surface 220 of the transparent insulating layer 218 between the step of forming the contact holes 222, 224 or contact holes 244, 248 in the transparent insulating layer 218 and the step of forming the reflective layers 226, 230, the light output direction and angle of the LED structure 242 or 252 may be controlled.

FIGS. 4A to 4E are sectional views illustrating manufacturing processes of an LED structure according to yet another embodiment of the present invention. In this embodiment, firstly, a transparent substrate 300 is provided, in which the material of the substrate 300 may be for example sapphire. Then, a buffer layer 302 is selectively grown on the substrate 300 by epitaxy, e.g. MOCVD. The material of the buffer layer 302 may be an undoped semiconductor, e.g. undoped GaN-series material.

Afterwards, an illuminant epitaxial structure is grown on the buffer layer 302 by epitaxy, e.g. MOCVD. In this embodiment, the illuminant epitaxial structure may include a first conductivity type semiconductor layer 304, an active layer 310 and a second conductivity type semiconductor layer 312 stacked in sequence on the buffer layer 302. The first conductivity type semiconductor layer 304 and the second conductivity type semiconductor layer 312 have different conductivity types. For example, one of the first conductivity type semiconductor layer 304 and the second conductivity type semiconductor layer 312 is n-type, and the other is p-type. The material of the illuminant epitaxial structure may be for example a GaN-series material. The active layer 310 may be for example an MQW structure.

Figure 4A:
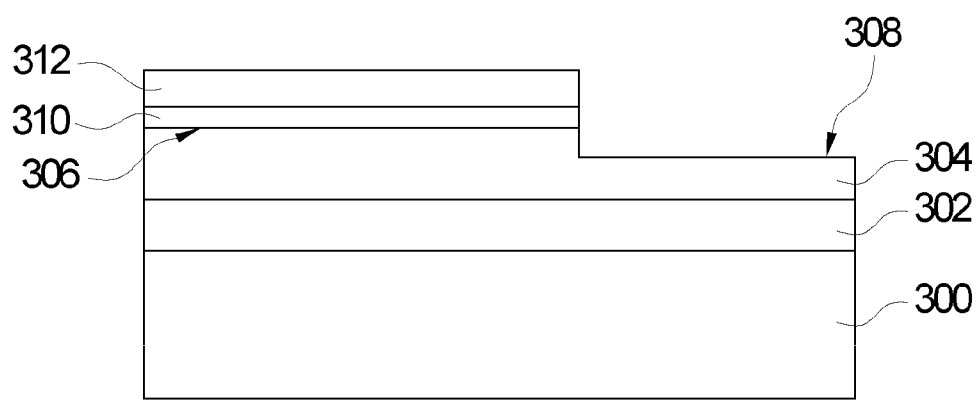
FIGS. 4A to 4E are sectional views illustrating processes of an LED structure according to yet another embodiment of the present invention.

Then, as shown in FIG. 4A, the illuminant epitaxial structure is defined by for example lithography and etching to remove a part of the second conductivity type semiconductor layer 312, a part of the active layer 310 and a part of the first conductivity type semiconductor layer 304, thus forming a mesa. After the illuminant epitaxial structure is defined, the first conductivity type semiconductor layer 304 has a first part 306 and a second part 308. The second conductivity type semiconductor layer 312 and the active layer 310 are disposed on the first part 306 of the first conductivity type semiconductor layer 304, and the second part 308 is exposed.

Thereafter, a first conductivity type contact layer 314 and a second conductivity type contact layer 318 are respectively formed on the second part 308 of the first conductivity type semiconductor layer 304 and a part of the second conductivity type semiconductor layer 312 by for example evaporation. Likewise, the LED structure may include at least one first conductivity type contact layer 314 and at least one second conductivity type contact layer 318. That is, the number of the first conductivity type contact layer 314 and the number of the second conductivity type contact layer 318 are both at least one. Preferably, the first conductivity type contact layer 314 and the second conductivity type contact layer 318 may be for example ohmic contact layers. When the first conductivity type is n-type, the material of the first conductivity type contact layer 314 may be for example ITO, TiAl, Cr/Pt/Au or Cr/Au. When the second conductivity type is p-type, the second conductivity type contact layer 318 may be a transparent oxide structure, e.g. a monolayer or multilayer structure of ITO, ZnO, AZO, GZO, $In_2O_3$ and $SnO_2$. In another embodiment, the material of the second conductivity type contact layer 318 may be Ni/Au or Ni/Ag.

Figure 4B:
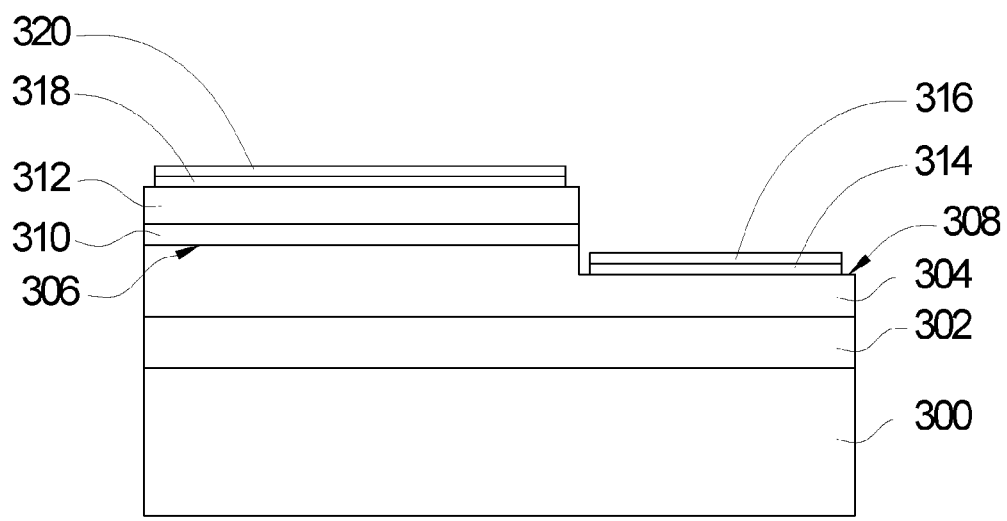

Thereafter, as shown in FIG. 4B, reflective layers 316, 320 are respectively formed on the first conductivity type contact layer 314 and the second conductivity type contact layer 318. In one embodiment, the reflective layers 316, 320 preferably have a structure of at least two layers, in which each of the reflective layers 316, 320 includes at least one attachment film and a reflective film stacked in sequence. The material of the attachment film may be for example Ti, Ni or TiW alloy, and the material of the reflective film may be for example Al or Ag.

Figure 4C:
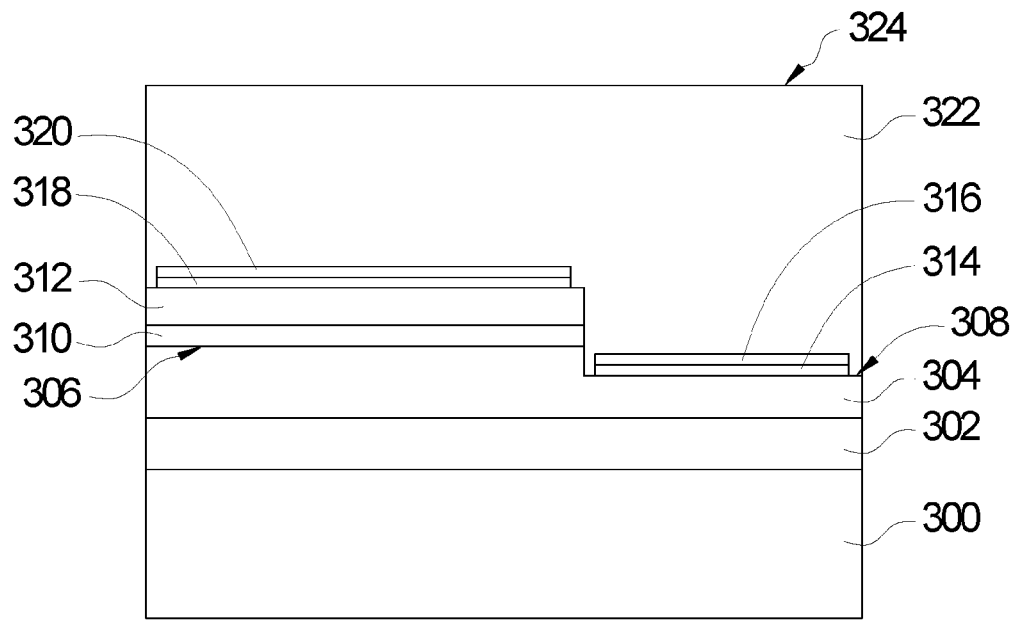

Then, as shown in FIG. 4C, a transparent insulating layer 322 is formed by deposition or coating, e.g. spin coating, to cover the first conductivity type semiconductor layer 304, the active layer 310 and the second conductivity type semiconductor layer 312 of the illuminant epitaxial structure, as well as the first conductivity type contact layer 314, the second conductivity type contact layer 318, the reflective layers 316, 320. The transparent insulating layer 322 preferably has a planarized surface 324, and the surface 324 is disposed opposite to the illuminant epitaxial structure. In an example, the material of the transparent insulating layer 322 may be a transparent oxide layer, e.g. SOG, a high polymer, $SiO_2$ or $TiO_2$. The thickness of the transparent insulating layer 322 is preferably between 0.5 µm and 100 µm.

Figure 4D:
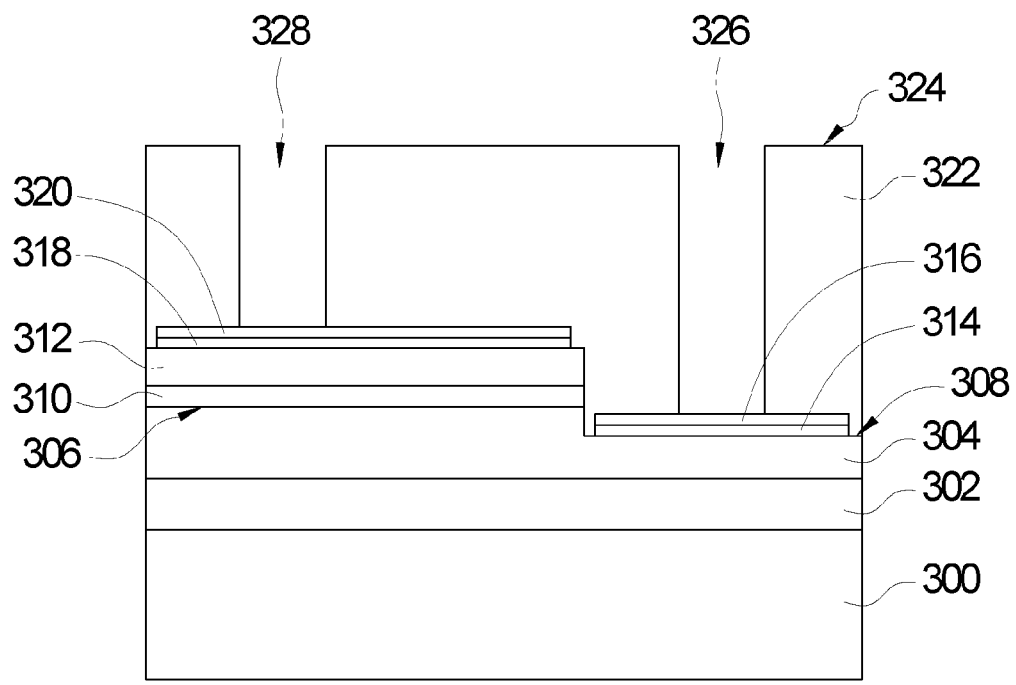

Then, as shown in FIG. 4D, a part of the transparent insulating layer 322 is removed by for example etching to form contact holes 326, 328 in the transparent insulating layer 322. The contact holes 326, 328 respectively expose a part of the reflective layer 316 and a part of the reflective layer 320.

Figure 4E:
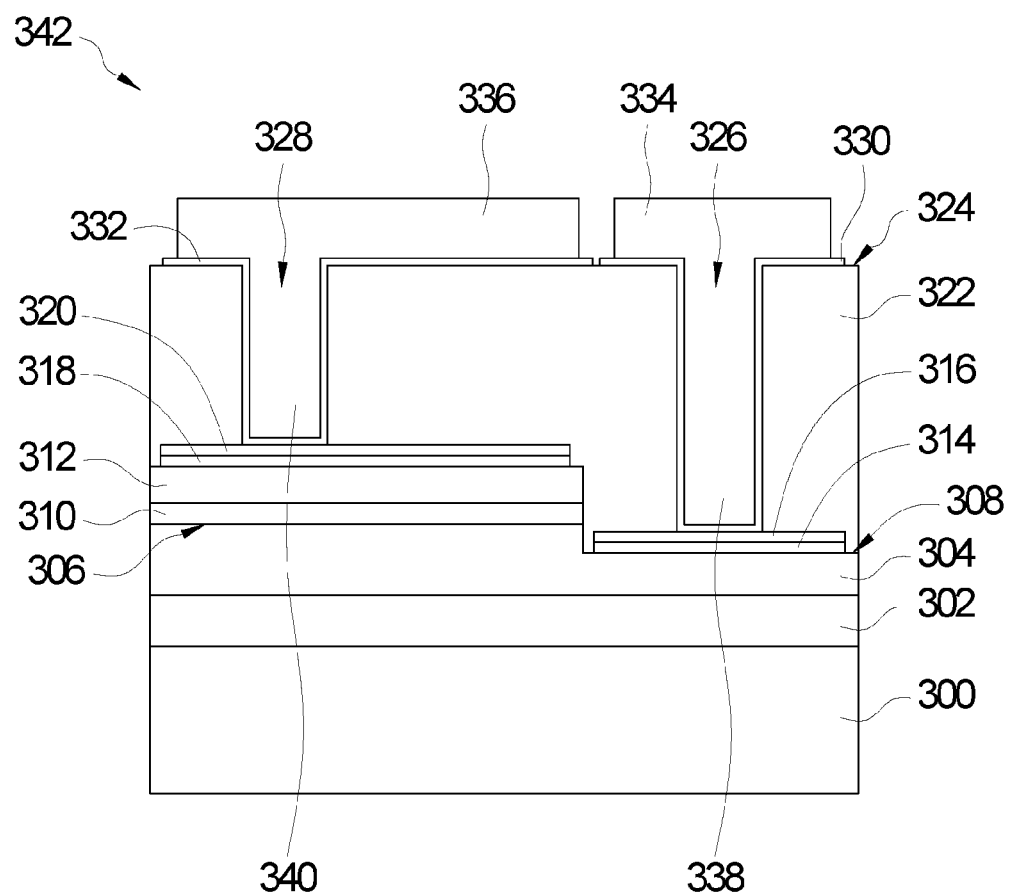

Referring to FIG. 4E, thereafter, barrier layers 330, 332 are selectively formed. The barrier layer 330 extends on and covers the contact hole 326 and a part of the surface 324 of the transparent insulating layer 322. The barrier layer 332 extends on and covers the contact hole 328 and the other part of the surface 324 of the transparent insulating layer 322. The barrier layers 330 and 332 are not in contact. The material of the barrier layers 330, 332 may be for example Ti, TiW alloy, W, Pt, Ni or any combination thereof. The barrier layers 330, 332 are respectively used to prevent the diffusion between the reflective layer 316 and a first conductivity type electrode 334 formed in the following process and the diffusion between the reflective layer 320 and a second conductivity type electrode 336 formed in the following process.

Then, as shown in FIG. 4E, the first conductivity type electrode 334 and the second conductivity type electrode 336 are formed by for example evaporation, sputtering, electroplating or chemical plating, thus finishing the fabrication of an LED structure 342. The first conductivity type electrode 334 is disposed on the barrier layer 330 and fills up the contact hole 326. The second conductivity type electrode 336 is disposed on the barrier layer 332 and fills up the contact hole 328. In the LED structure 342, the part of the first conductivity type electrode 334 disposed on the contact hole 326 may be referred to as a contact plug 338, and the part of the second conductivity type electrode 336 disposed on the contact hole 328 may be referred to as a contact plug 340. In one embodiment, the first conductivity type electrode 334 and the second conductivity type electrode 336 may include a multilayer structure, and the multilayer structure includes for example Au or Ni and a eutectic metal of AuSn or AgSnCu disposed above Au or Ni.

In one embodiment, as shown in FIG. 4E, in addition to the contact plugs 338, 340, the first conductivity type electrode 334 and the second conductivity type electrode 336 are preferably disposed in the same plane. After the fabrication of the LED structure 342 is finished, a packaging process may be carried out. In this embodiment, the LED structure 342 is suitable for a flip-chip packaging process. Since the first conductivity type electrode 338 and the second conductivity type electrode 340 are disposed in the same plane, the difficulty of the flip-chip of the LED structure 342 is greatly reduced, thus improving the reliability of the flip-chip process.

In this embodiment, similar to the embodiment of FIG. 3, sidewalls of the two contact holes 326, 328 of the LED structure 342 are both inclined relative to the illuminant epitaxial structure, thus controlling the light output direction and angle of the LED structure 342. Furthermore, at least one pattern structure, e.g. a regular pattern structure or an irregular pattern structure may also be disposed on the surface 324 of the transparent insulating layer 322 between the step of forming the contact holes 326, 328 in the transparent insulating layer 322 and the step of forming the barrier layers 330, 332, so as to change the light output direction and angle of the LED structure 342.

It can be seen from the above embodiments that, among other things, an advantage of the present invention lies in that the present invention uses the transparent insulating layer to separate the reflective layer and the illuminant epitaxial structure, thus reducing the influence of the heat generated by the illuminant epitaxial structure during high power operation on the stability of the reflective layer.

It can be seen from the above embodiments that, among other things, another advantage of the present invention lies in that the two conductivity type electrodes of the LED structure of the present invention may be both disposed on the transparent insulating layer, thus reducing the area of the contact electrode and increasing the overall light-emitting area, and further improving the luminous efficiency of the LED structure.

It can be seen from the above embodiments that, among other things, yet another advantage of the present invention lies in that in the method for manufacturing an LED structure of the present invention, at least one pattern structure may be fabricated on the transparent insulating layer to control the light output direction and angle of the LED structure, thus improving the light extraction efficiency.

It can be seen from the above embodiments that, among other things, a further advantage of the present invention lies in that the two conductivity type electrodes of the present invention have contact plugs extending to the contact layer, and the contact plugs may serve as the heat flow passage of the illuminant epitaxial structure, thus reducing the influence of the heat generated in operation on the LED structure.

It can be seen from the above embodiments that, among other things, an alternative advantage of the present invention lies in that the two conductivity type electrodes of the present invention may be lifted and disposed on the transparent insulating layer, so that the area of the electrode can be expanded, and the two conductivity type electrodes can be disposed in the same plane, which greatly reduces the difficulty of flip-chip, thus improving the reliability of the flip-chip process.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:
1. A light-emitting diode (LED) structure, comprising:
a substrate;
an illuminant epitaxial structure, comprising:
a first conductivity type semiconductor layer, disposed on the substrate;
an active layer, disposed on a first part of the first conductivity type semiconductor layer and exposing a second part of the first conductivity type semiconductor layer; and
a second conductivity type semiconductor layer, disposed on the active layer and having a conductivity type different from that of the first conductivity type semiconductor layer;

at least one first conductivity type contact layer, disposed on the second part of the first conductivity type semiconductor layer;

at least one second conductivity type contact layer, disposed on the second conductivity type semiconductor layer;

a transparent insulating layer, covering the illuminant epitaxial structure, the at least one first conductivity type contact layer and the at least one second conductivity type contact layer and having a top surface, wherein the transparent insulating layer comprises a first contact hole and a second contact hole respectively exposing a part of the at least one first conductivity type contact layer and a part of the at least one second conductivity type contact layer;

a first reflective layer, covering sidewalls of the first contact hole, an exposed part of the at least one first conductivity type contact layer, and a part of the top surface of the transparent insulating layer;

a second reflective layer, covering sidewalls of the second contact hole, an exposed part of the at least one second conductivity type contact layer, and the other part of the top surface of the transparent insulating layer;

a first conductivity type electrode, disposed on the first reflective layer and filling up the first contact hole; and a second conductivity type electrode, disposed on the second reflective layer and filling up the second contact hole.

2. The LED structure according to claim 1, further comprising a first barrier layer disposed between the first reflective layer and the first conductivity type electrode and a second barrier layer disposed between the second reflective layer and the second conductivity type electrode.

3. The LED structure according to claim 1, wherein the first conductivity type electrode and the second conductivity type electrode are disposed in the same plane.

4. The LED structure according to claim 1, wherein a material of the transparent insulating layer comprises spin on glass (SOG), a polymer, $SiO_2$ or $TiO_2$.

5. The LED structure according to claim 1, wherein a thickness of the transparent insulating layer is between 0.5 µm and 100 µm.

6. The LED structure according to claim 1, wherein one of the sidewalls of the first contact hole and one of the sidewalls of the second contact hole are inclined relative to the illuminant epitaxial structure.

7. The LED structure according to claim 1, wherein the transparent insulating layer comprises at least one pattern structure.

* * * * *